United States Patent [19]
Butson

[11] Patent Number: 4,602,234
[45] Date of Patent: Jul. 22, 1986

[54] COIL ARRANGEMENTS

[75] Inventor: Peter C. Butson, Harrow, England

[73] Assignee: Picker International, Limited, Wembley, England

[21] Appl. No.: 703,897

[22] Filed: Feb. 21, 1985

[30] Foreign Application Priority Data

Feb. 27, 1984 [GB] United Kingdom ................. 8405066

[51] Int. Cl.⁴ ............................................... H01F 5/00
[52] U.S. Cl. ...................................... 335/299; 324/320
[58] Field of Search ................. 335/299, 216; 324/318, 324/319, 320, 321, 322

[56] References Cited

U.S. PATENT DOCUMENTS 4,398,149  8/1983  Zens ...................................... 324/319

FOREIGN PATENT DOCUMENTS 0047065   3/1982  European Pat. Off. ............ 324/318
0084946   8/1983  European Pat. Off. ............ 324/318
2056086  10/1979  United Kingdom ................. 324/318

OTHER PUBLICATIONS

Funkschau 3/1982—Stetter, Kestler, "Bildgehende Kernresonanz", pp. 43–48, p. 45, col. 3, lines 24,25.

Primary Examiner—George Harris
Attorney, Agent, or Firm—Watts, Hoffmann, Fisher & Heinke Co.

[57] ABSTRACT

A coil arrangement for use in generating and detecting nuclear magnetic resonance (NMR) in a body, e.g. an NMR imaging apparatus, which comprises a conductor arrangement which can be used both as an RF field generating coil and an orthogonally polarized RF field detecting coil. The arrangement comprises a plurality of non-magnetic electrically conductive paths (34 to 50) extending generally parallel to the axis of a cylindrical volume, and means (51, 53) interconnecting the paths at each of their ends. An input signal applied to diametrically opposite paths (36 and 46) causes currents to flow in loops formed by the paths and interconnections so as to produce a field directed perpendicular to the axis of the volume, and an output for application to a detector is derived from diametrically opposite paths (31 and 41) which are orthogonal to the paths to which the input signal is applied so that zero current is induced in them by the field produced by the input signal.

10 Claims, 6 Drawing Figures

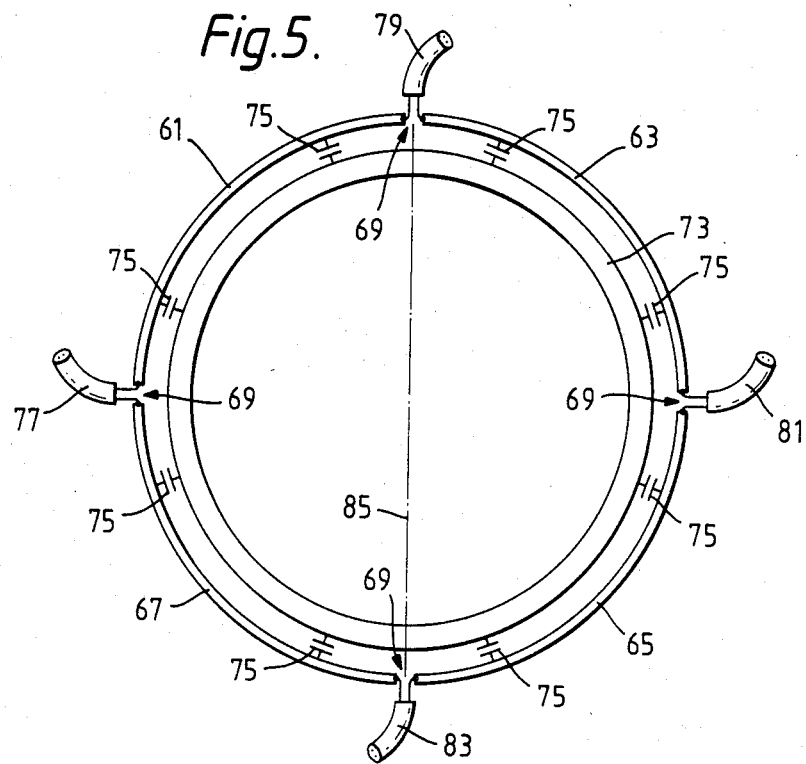
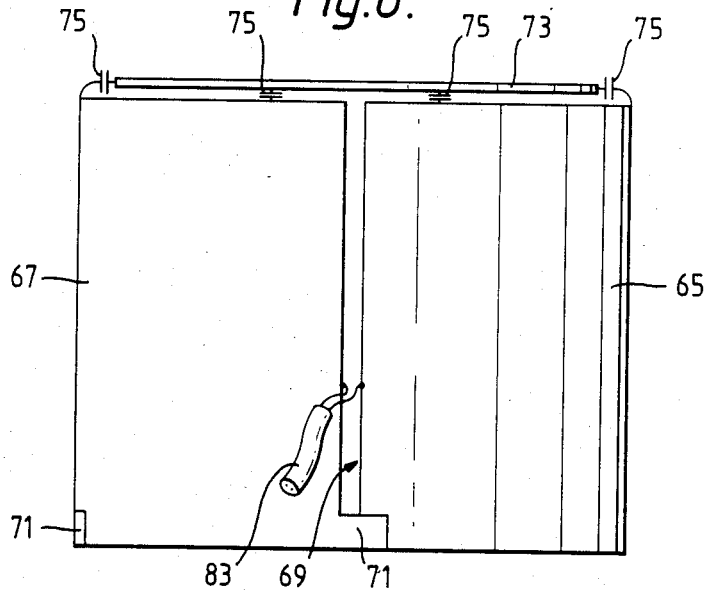

COIL ARRANGEMENTS

This invention relates to coil arrangements.

More especially the invention relates to coil arrangements suitable for producing and detecting nuclear magnetic resonance (NMR) in an NMR imaging apparatus.

In such apparatus nuclear magnetic resonance is excited in a body to be imaged by applying to the body an RF magnetic field in a direction transverse to the direction of a relatively strong static magnetic field applied to the body. After excitation the same or another coil arrangement is used to detect the excited nuclear magnetic resonance.

The use of the same coil for both excitation and detection presents the problem of keeping RF energy out of the detector during excitation.

For this reason it is usually preferred to use separate coils for excitation and detection which are orthogonally polarised i.e. the detection coil is designed so as to be sensitive to magnetic fields orthogonal to the field produced by the excitation coil. Where, as is conventional, the two coils are each of tubular form this presents the problem that the two coils occupy more space than one. Furthermore since one coil has to surround the other and can therefore not be closely spaced to the body being imaged, operation at high RF frequencies is more difficult.

It is an object of the present invention to provide a coil arrangement which overcomes these difficulties.

According to the invention a high frequency coil arrangement for use in generating and detecting nuclear magnetic resonance in a body comprises: a plurality of non-magnetic, electrically conductive paths extending generally parallel to the axis of a generally cylindrical volume and disposed around the volume; means interconnecting said paths at each of their ends, at least in respect of the passage of currents at said high frequency; first coupling means for causing currents corresponding to a high frequency input signal to flow in loops formed by said paths and interconnection means which embrace said volume, thereby to produce a magnetic field in the volume in a given direction substantially perpendicular to the axis of said volume; and second coupling means for applying to detecting means a signal corresponding to the current in at least one said path in which the induced current in the presence of said field is substantially zero.

In one arrangement in accordance with the invention said first coupling means comprises means for applying an input signal across a gap in each of two paths on opposite sides of said volume, and said second coupling means comprises means for deriving an output from across a gap in each of two further paths on opposite sides of said volume, which further paths lie substantially in a plane at right angles to the plane of said first-mentioned two paths.

In another arrangement said first connection means comprises means for applying input signals between the paths of each of two adjacent pairs of paths lying on opposite sides of said volume, and said second coupling means comprises means for deriving outputs from between the paths of each of two further adjacent pairs of paths on opposite sides of said volume, which further adjacent pairs lie generally in a plane at right angles to the plane of said first-mentioned two adjacent pairs.

Said paths may be constituted by discrete conductive elements, or by portions of sheets of conductive material.

In one particular arrangement in accordance with the invention said paths are constituted by portions of four arcuate sheets of conductive material disposed at spaced positions around the curved surface of said volume and each of which subtends an angle of substantially 90° at the axis of the volume, said first coupling means comprises means for applying an input signal between the adjacent edges of one adjacent pair of said sheets and between the adjacent edges of the other pair of sheets; and said second coupling means comprising means for deriving an output from between the adjacent edges of each adjacent pair of sheets comprising one of said one pair and one of said other pair of said sheets.

The invention will now be further explained and two coil arrangements in accordance with the invention will be described, by way of example, with reference to the accompanying drawings in which:

FIG. 5 is an end view of a second coil arrangement in accordance with the invention; and FIG. 6 is a side view of the coil arrangement of FIG. 5.

A magnetic field in a cylindrical volume directed parallel to the axis of the volume can, of course, be produced by a coil wound helically around the curved surface of the volume. However, such a coil arrangement is often not convenient for use in producing the RF field required for an NMR imaging apparatus because it is often necessary to be able to insert a body to be imaged into the volume in a direction perpendicular to the direction of the RF field. This arises when the coils used to produce the strong static magnetic field directed transverse to the RF field in an NMR imaging apparatus prevent access to the field except in the direction of the static field. Hence for NMR imaging apparatus an RF coil arrangement is often required which produces a field directed perpendicular to the axis of a cylindrical volume whilst leaving the ends of the volume open for insertion of a body to be imaged.

A magnetic field in a cylindrical volume directed perpendicular to the axis of the volume can theoretically be obtained by causing currents to flow in an axial direction in a tube disposed coaxially with the cylindrical volume with the current in one arcuate half of the tube oppositely directed to the current in the other half.

Figure 1:
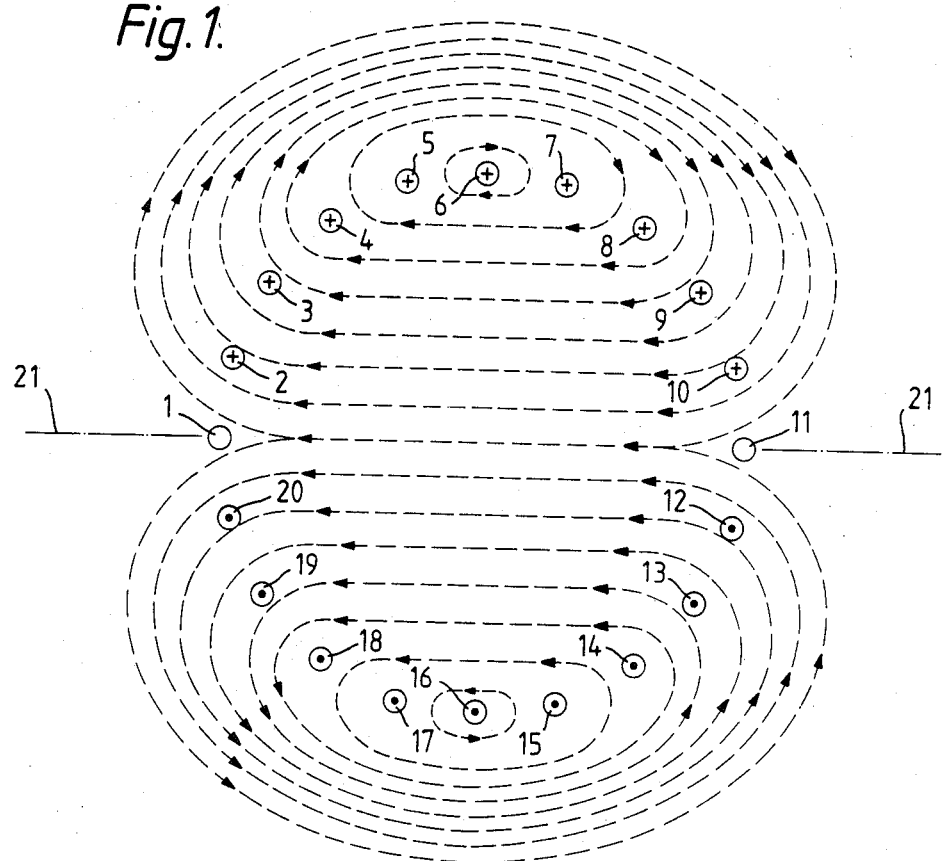
FIG. 1 is a diagram illustrating the basic principle of operation of a coil arrangement for producing a field in a cylindrical volume in a direction perpendicular to the axis of the volume.

Referring now to FIG. 1, in practice the currents are carried by discrete conductors extending parallel to the axis of the volume and spaced around the curved surface of the volume, twenty such conductors 1 to 20 being shown in FIG. 1. When the currents in the conductors 2 to 10 lying on one side of a plane 21 bisecting the volume and containing the axis of the volume are oppositely directed to the currents in the conductors 12 to 20 on the other side of the plane 21, as indicated by the dots and crosses in FIG. 1, a magnetic field directed parallel to the plane 21 is obtained in the volume, perpendicular to the axis of the volume, as indicated by the dotted lines and arrows in FIG. 1.

It will be noted that no current is required to flow in conductors 1 and 11 lying in the plane 21.

It will be understood that in order for the field to be as nearly as possible uniform throughout the volume, as is normally desirable, the relative amplitudes of the currents and/or the spacings of the individual conductors must be such that the current distribution is at least approximately sinusoidal around the curved surface of the volume. However, for the sake of simplicity, this consideration will hereinafter be ignored.

Figure 2:
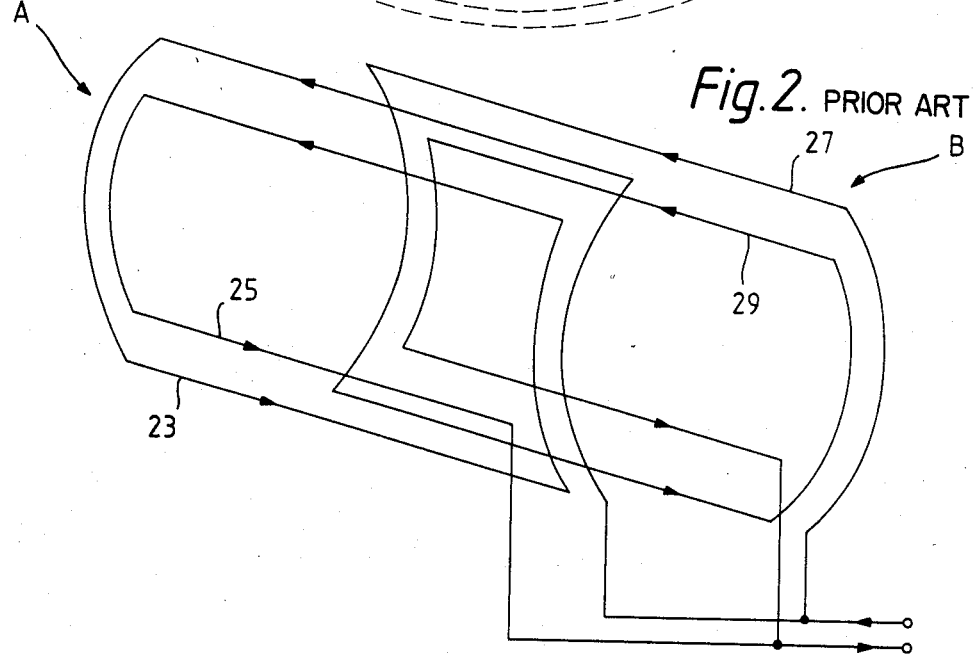
FIG. 2 is a diagram illustrating a conventional coil arrangement for producing a field embodying the principle illustrated in FIG. 1.

Known practical coil arrangements embodying the principle of FIG. 1 utilise so-called saddle coils, one such arrangement being illustrated in FIG. 2. This arrangement comprises two similar halves A and B each comprising several saddle shaped turns 23, 25, 27 and 29 disposed one within the other, the two halves being positioned on opposite sides of, and on the curved surface of, a cylindrical volume in which a transverse magnetic field is required. In FIG. 2 only two turns 23 and 25 or 27 and 29 are shown in each half for the sake of clarity.

As can be seen in FIG. 2, each turn is thus disposed with its straight parts extending parallel to the axis of the volume, which straight parts are distributed around the curved surface of the volume, as required. The turns in each half 23 and 25 or 27 and 29 are connected in series, as shown in FIG. 2, and the two halves are driven in parallel from a common RF source (not shown). Thus in use the current in the straight parts of the turns on one side of a plane bisecting the coils and containing the axis of the volume is in the opposite direction to the current in the straight parts of the turns lying on the other side of the plane, thus producing a field directed parallel to the plane, perpendicular to the axis of the volume, as required.

In an NMR imaging apparatus, after exciting nuclear magnetic resonance in a body to be imaged it is then required to detect the excited nuclear magnetic resonance. As described above, this can be done using a second coil arrangement as shown in FIG. 2, sensitive to fields orthogonal to those produced by the excitation coil arrangement. This is possible because the excited nuclear magnetic spins have a rotating vector. However, one coil arrangement, normally the detector coil arrangement, is then required to be inside the other with the disadvantages mentioned above.

Two coil arrangements in accordance with the invention which effectively comprise a single conductor arrangement which performs the function of both orthogonal coil arrangements of the prior art arrangements thereby avoiding the above-mentioned disadvantages, will now be described by way of example.

Figure 3:
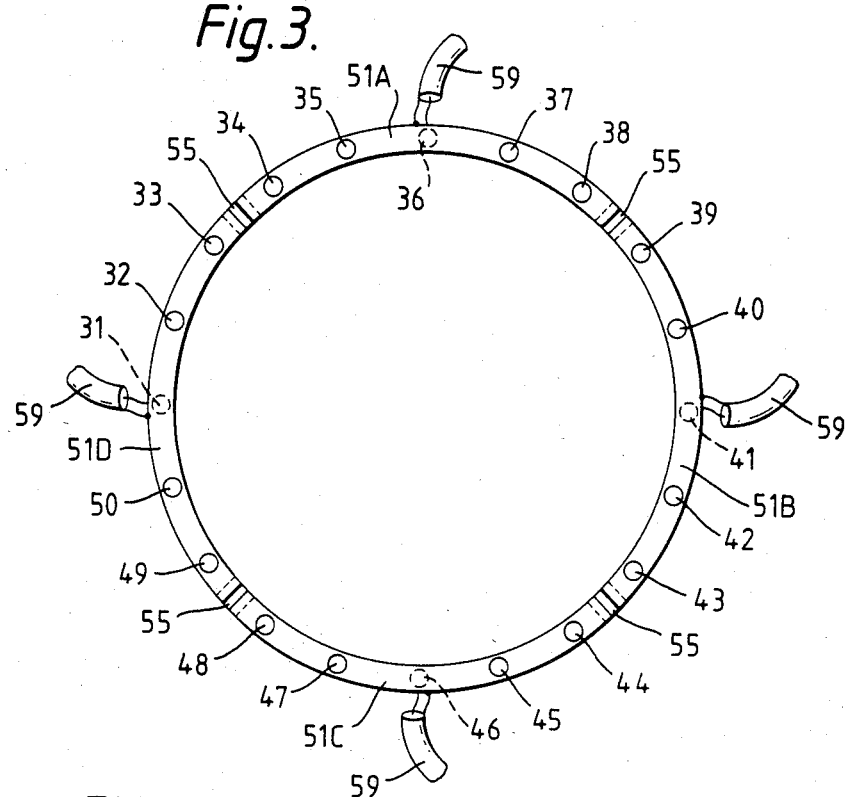
FIG. 3 is an end view of a first coil arrangement in accordance with the invention.
Figure 4:
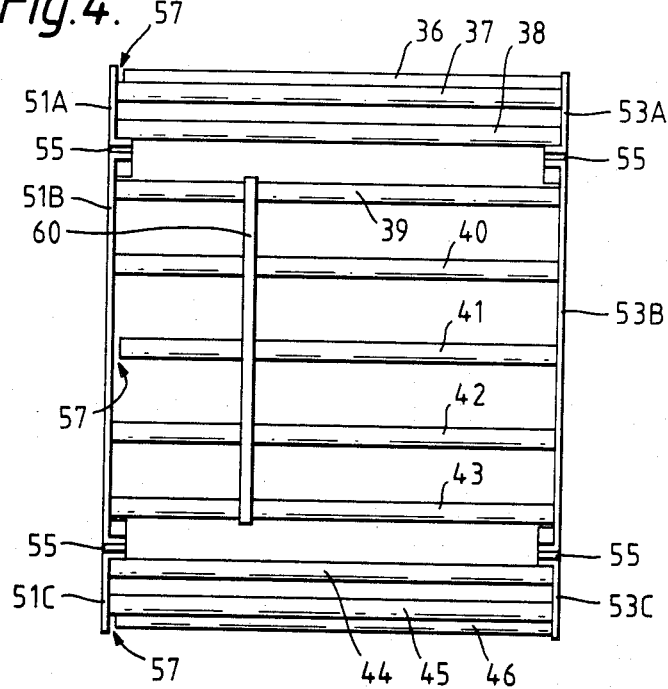
FIG. 4 is a side view of the arrangement of FIG. 3.

Referring to FIGS. 3 and 4, the first arrangement to be described comprises a number of non-magnetic electrically conductive elongated members 31 to 50, suitably copper tubes, disposed in parallel spaced relation around a circle so as to lie on the curved surface of a cylindrical volume. At each end the members 31 to 50 are interconnected in respect of the passage of RF currents by a ring 51 or 53. Each ring 51 or 53 consists of four 90° arcuate sections A, B, C and D separated by shims 55 of dielectric material, the shims fitting between flanges formed at the ends of the sections. The shims provide capacitance to tune the arrangement to approximately the frequency at which it is intended to operate, and prevent low frequency currents circulating in the rings, due for example to slowly varying gradient fields which are often used in NMR imaging apparatus. Conveniently the shims in one ring only are selected for tuning purposes, and the shims in the other ring are provided solely to prevent low frequency circulating currents.

For connection of the coil arrangement to an RF source for NMR excitation purposes, and to a receiver for NMR detection purposes, there is a gap 57 between one end of each of the four members 31, 36, 41 and 46 and the adjacent ring 51, the four members being those which are at the centres of the quadrant ring sections.

A suitable feeder 59 e.g. a coaxial cable, is connected across each gap, the feeders 59 being omitted in FIG. 4 for clarity.

In operation, for NMR excitation, balanced RF e.m.f.s from a transmitter (not shown) are respectively applied via the associated feeders 59 across the gaps 57 in a diametrically opposite pair of the members 31, 36, 41 and 46, e.g. members 36 and 46 in FIG. 3 and 4.

Balanced outputs for application to a receiver (not shown) for NMR detection purposes are derived via the associated feeders 59 from across the gaps 57 in the other diametrically opposite pair of the members 31, 36, 41 and 46, i.e. members 31 and 41 in the present example.

The applied e.m.f.s are phased so as to cause current flow around the loop constituted by the members 36 and 46 and the rings 51 and 53, this loop being tuned to the frequency of the e.m.f.s by the capacitance provided by shims 55. As a result a magnetic field is produced in a direction through the loop i.e. perpendicular to the axis of the volume embraced by the members 31 to 50 and parallel to the plane of the members 31 and 41. By induction, similar currents are caused to flow in the other loops constituted by the other members 31 to 50 and the rings 51 and 53, thus providing an RF magnetic field throughout the volume embraced by the members.

However, it will be appreciated that no currents are induced in the conductors 31 and 41. Hence during excitation no input is applied to the NMR detection receiver.

During detection the excited nuclear magnetic spins result in a magnetic vector rotating in the plane of the paper of FIG. 3 at the excitation frequency. Hence the spins induce e.m.f.s in all of the members 31 to 50, the e.m.f.s across the gaps 57 in the members 31 and 41 being applied to the receiver. It will be apparent that the total e.m.f. applied to the receiver is that due to the flux linked with the loop constituted by members 31 and 41 and the rings 51 and 53.

In order to enable the coupling of the receiver with the field produced by the excited spins to be varied, straps connecting appropriate ones of the members 31 to 50 may be provided. For example, if a strap 60 connecting members 39 to 43 is provided, as indicated in FIG. 4, some of the current which would flow through an external circuit connected across the gap 57 in conductor 41 will now flow via the strap to the neighbouring members 39, 40, 42 and 43, so reducing the coupling. It will be seen that the coupling is reduced as the position of the strap approaches the gap in member 41. The strap or straps will normally be fixed in position during manufacture rather than being made adjustable in position.

Referring now to FIGS. 5 and 6, the second arrangement to be described comprises four sheets 61, 63, 65 and 67 of non-magnetic electrically conductive material e.g. copper. The four sheets lie at spaced positions around the curved surface of a cylindrical volume, each sheet subtending an angle of approximately 90° at the axis of the volume.

Over the major part of their lengths there is a small gap 69 between the adjacent edges of each adjacent pair of the sheets, but at one end of one longer edge of each sheet there is a tab 71 by means of which that sheet is electrically connected to the adjacent sheet, thereby to form an electrically conductive ring at one end of the sheets.

At the other end of the sheets there is a ring 73 of non-magnetic electrically conductive material, e.g. copper, separate from the sheets, but capacitively coupled to the sheets. The capacitive coupling may be provided by discrete capacitors, for example, one at each side of each sheet as illustrated in the drawings by capacitors 75. Alternatively, the ring 73 may be positioned sufficiently closely to the ends of the sheets, with or without interposed dielectric material, to achieve the desired capacitive coupling.

The capacitive coupling serves to tune the arrangement, in similar manner to the capacitance provided by the shims 55 in FIG. 3. If desired shims (not shown) of dielectric material may be provided at the tabs 71 to avoid providing a path for low frequency circulating currents in the ring formed by the tabs.

Connection of the coil arrangement to an RF source for NMR excitation purposes and to a receiver for NMR detection purposes is made by way of four balanced feeders 77, 79, 81 and 83. The conductors of each feeder are connected to corresponding points on the adjacent edges of a respective adjacent pair of the sheets, slightly above the tab 71 bridging the gap 69 between those adjacent edges.

In operation, for NMR excitation, RF e.m.f.s from a transmitter (not shown) are applied to each of one diametrically opposite pair of the feeders 77, 79, 81 and 83, say 77 and 81.

Similarly, balanced outputs for application to a receiver for NMR detection purposes are derived by way of the other diametrically opposite pair of feeders, i.e. feeders 79 and 83 in the present example.

The e.m.f. applied by way of feeder 77 causes currents to flow in loops embracing the gap 69 between the sheets 61 and 67 to which the feeder 77 is connected, which loops are constituted by those sheets 61 and 67 and the conductive rings at the ends of the sheets. The e.m.f. applied by way of feeder 81 similarly causes currents to flow in loops embracing the gap 69 between the sheets 63 and 65 to which it is connected and constituted by those sheets 63 and 65 and the conductive rings at the ends of the sheets. As a result, with the two e.m.f.s appropriately phased an RF magnetic field directed perpendicular to the plane 85 indicated in FIG. 5, i.e. perpendicular to the planes of the loops, is produced in the volume embraced by the coil arrangement.

However, it will be appreciated that during excitation no e.m.f.s are applied via feeder 79 or 83 to the receiver since the loops constituted by the conductive rings and the sheets 61 and 63 or 65 and 67 with which each of the feeders 79 and 83 is connected are parallel to the direction of the field produced during excitation, i.e. there is no linkage of these loops with the magnetic flux produced during excitation.

During detection the rotating magnetic spin vectors will clearly induce e.m.f.s in the loops associated with feeders 79 and 83, thus causing balanced e.m.f.s to be applied to the receiver.

In a modification of the arrangement of FIGS. 5 and 6 the sheets 61, 63, 65 and 67 may be each replaced by a structure comprising parallel spaced bars joined at each end by quarter circle rings.

Similarly, in a modification of the arrangement of FIGS. 3 and 4 each of the ring sections and the associated ones of members 31 to 50 may be replaced by an arcuate copper sheet, the gaps in the central members 31, 36, 41 and 46 being replaced by slots cut in the sheets.

It will be understood that whilst in the arrangements described above by way of example the excitation and detection is effected by direct connection, in other arrangements excitation and detection may be effected by capacitive or inductive coupling e.g. in the case of the arrangement of FIGS. 5 and 6, via small loops positioned in the gaps 69.

I claim:

1. A high frequency coil arrangement for use in generating and detecting nuclear magnetic resonance in a body comprising: a plurality of non-magnetic, electrically conductive paths extending generally parallel to the axis of a generally cylindrical volume and disposed around the volume; means interconnecting said paths at each of their ends, at least in respect of the passage of currents at said high frequency; first coupling means for causing currents corresponding to a high frequency input signal to flow in loops formed by said paths and interconnection means which embrace said volume, thereby to produce a magnetic field in the volume in a given direction substantially perpendicular to the axis of said volume; and second coupling means for applying to detecting means a signal corresponding to the current in at least one said path in which the induced current in the prersence of said field is substantially zero.

2. A coil arrangement according to claim 1 wherein said first coupling means comprises means for applying an input signal across a gap in each of two paths on opposite sides of said volume, and said second coupling means comprises means for deriving an output from across a gap in each of two further paths on opposite sides of said volume, which further paths lie substantially in a plane at right angles to the plane of said first-mentioned two paths.

3. A coil arrangement according to claim 1 wherein said first coupling means comprises means for applying input signals between the paths of each of two adjacent pairs of paths lying on opposite sides of said volume, and said second coupling means comprises means for deriving outputs from between the paths of each of two further adjacent pairs of paths on opposite sides of said volume which further adjacent pairs of paths lie generally in a plane at right angles to the plane of said first-mentioned two adjacent pairs.

4. A coil arrangement according to claim 1 wherein said paths are constituted by discrete conductive elements.

5. A coil arrangement according to claim 1 wherein said paths are constituted by portions of sheets of conductive material.

6. A coil arrangement according to claim 5 wherein said paths are constituted by portions of four arcuate sheets of conductive material disposed at spaced positions around the curved surface of said volume and each of which subtends an angle of substantially 90° at the axis of the volume, said first coupling means comprises means for applying an input signal between the adjacent edges of one adjacent pair of said sheets and between the adjacent edges of the other pair of sheets; and said second coupling means comprising means for deriving an output from between the adjacent edges of each adjacent pair of sheets comprising one of said one pair and one of said other pair of said sheets.

7. A coil arrangement according to claim 1 wherein said loops incorporate capacitance.

8. A coil arrangement according to claim 1 wherein said interconnecting means is in the form of two rings one at each end of said paths.

9. A coil arrangement according to claim 8 wherein at least one of said rings comprises a plurality of capacitively coupled sections.

10. A coil arrangement according to claim 8 wherein at least one of said rings is capacitively coupled to the adjacent ends of said paths.

* * * * *